(12) United States Patent
Gibson et al.

(10) Patent No.: US 7,373,265 B2
(45) Date of Patent: May 13, 2008

(54) DATA STORAGE DEVICE AND A METHOD OF READING DATA IN A DATA STORAGE DEVICE

(75) Inventors: Gary A. Gibson, Palo Alto, CA (US); Robert Walmsley, Palo Alto, CA (US); James W. Pearson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 600 days.

(21) Appl. No.: 10/660,297

(22) Filed: Sep. 10, 2003

(65) Prior Publication Data

US 2005/0055170 A1 Mar. 10, 2005

(51) Int. Cl.
*G01R 25/00* (2006.01)
(52) U.S. Cl. .................................. 702/65; 369/126
(58) Field of Classification Search ................. 702/65; 369/126, 44, 23; 250/306; 310/309
See application file for complete search history.

(56) References Cited

U.S. PATENT DOCUMENTS

| 5,329,122 | A | * | 7/1994 | Sakai et al. ................ 250/306 |
| 5,396,066 | A | * | 3/1995 | Ikeda et al. ................ 250/306 |
| 5,546,374 | A | * | 8/1996 | Kuroda et al. .............. 369/126 |
| 5,777,977 | A | * | 7/1998 | Fujiwara et al. ............ 369/126 |
| 5,856,967 | A | | 1/1999 | Mamin et al. |
| 6,072,764 | A | * | 6/2000 | Shido et al. ................ 369/126 |
| 6,477,132 | B1 | * | 11/2002 | Azuma et al. .............. 369/126 |
| 6,519,221 | B1 | | 2/2003 | Manalis et al. |
| 6,665,239 | B1 | * | 12/2003 | Takahashi et al. ........ 369/44.23 |
| 2003/0202456 | A1 | * | 10/2003 | Hong et al. ................ 369/126 |
| 2003/0210640 | A1 | * | 11/2003 | Min et al. .................. 369/126 |
| 2005/0047288 | A1 | * | 3/2005 | Maeda et al. ............ 369/44.26 |
| 2006/0219905 | A1 | * | 10/2006 | Gibson et al. .............. 250/310 |

\* cited by examiner

*Primary Examiner*—John Barlow
*Assistant Examiner*—Aditya S. Bhat

(57) ABSTRACT

The present invention includes a data storage device and a method of reading data in a data storage device. Accordingly, a first aspect of the present invention is a data storage device. The data storage device includes a probe tip mounted on a suspension mechanism, a data storage layer, at least one conducting layer wherein a capacitance is formed between the suspension mechanism and the at least one conducting layer and a sensor for sensing a change in the capacitance based on a displacement of the probe tip due to the presence of a bit.

20 Claims, 5 Drawing Sheets

DATA STORAGE DEVICE AND A METHOD OF READING DATA IN A DATA STORAGE DEVICE

FIELD OF THE INVENTION

The present invention relates generally to data storage media and more particularly to a data storage device and a method of reading data in a data storage device.

BACKGROUND OF THE INVENTION

Storage media for computers and other types of electronic devices generally come in two types: volatile memory and non-volatile memory. Volatile memory loses its contents when power is no longer being supplied to the memory, whereas non-volatile memory maintains its contents even when power is not being supplied to the memory. The most common type of volatile memory is dynamic random-access memory (DRAM), which is most commonly available as and implemented as an integrated circuit (IC). The term data storage medium is used herein in a broad sense, and encompasses IC memory, as well as other types of data storage media.

By comparison, non-volatile memory has perhaps more commonly been available as and implemented as magnetic and optical media, including hard disk drives, floppy disks, compact disc read-only memories (CD-ROM's), CD re-writable (CD-RW) discs, and digital versatile discs (DVD's), among others. Historically, non-volatile memory implemented as an IC was primarily available as ROM that was not re-recordable, such as hard-wired ROM and programmable ROM (PROM). More recently, IC non-volatile memory has become available as various types of flash memory, which is more technically known as electrically erasable PROM (EEPROM).

It is a general aim for the computer industry to increase the storage density of the storage media being used by computers. Every new technology, however, should offer long-term perspectives in order to give room for continued improvements within the new technology. This is due to the fact that with every fundamental change of storage technology, the computer industry has to undertake remarkable investments in order to adapt existing production machines or to replace existing machines by new ones for any technical purpose involved with said new technology. Thus, the consequence for further development of storage systems is that any new technique with better storage area density should have a long-term potential for further scaling, desirably down to the nanometer scale.

The only available tool known today that is simple and yet provides these very long term perspectives is a nanometer probe tip. Such tips are used in every atomic force microscope (AFM) and scanning tunneling microscope (STM) for imaging and structuring down to the atomic scale. The simple tip is a very reliable tool that concentrates on one functionality: the ultimate local confinement of interaction.

In recent years, AFM thermo-mechanical recording in polymer storage media has undergone extensive modifications mainly with respect to the integration of sensors and heaters designed to enhance simplicity and to increase data rate and storage density. Using heated cantilevers, thermo-mechanical recording at 400 Gb/in$^2$ storage density and data rates of a few Mb/s for reading and 100 kb/s for writing have been demonstrated.

Such prior art thermo-mechanical writing is a combination of applying a local force by the cantilever/tip to a polymer layer and softening it by local heating. By applying sufficient heat an indentation can be formed into the storage medium for writing a bit which can be read back with the same tip, by the fact that the lever is bent when it is moved into the indentation and the electrical resistance of a sensing circuit is changed therewith.

While writing data or bits, the heat transfer from the tip to the polymer through the small contact area is initially very poor and improves as the contact area increases. This means the tip must be heated to a relatively high temperature to initiate the melting process. Once melting has commenced, the tip is pressed into the polymer, which increases the heat transfer to the polymer, increases the volume of melted polymer, and hence increases the bit size. After melting has started and the contact area has increased, the heating power available for generating the indentations increases by at least ten times to become 2% or more of the total heating power (depending on the design). In order to provide a complete data storage method, a read process must be proposed that can provide adequate Signal-to-Noise Ratio (SNR) at an acceptable data rate.

A conventional method for reading data depends on the modulation of the gap between a warm (non-writing) cantilever and the data storage medium. The gap modulation is produced by the tip following medium topography introduced by the writing process just described. The described gap modulation generates a synchronous modulation in the cantilever temperature through a variation in thermal flux between cantilever and medium. The temperature coefficient of resistivity of the heater translates this temperature variation into a resistance variation, which is sensed by appropriate electronics as the output signal. However, the bandwidth or data rate for this read method is fundamentally limited by the thermal time constant of the heater/cantilever.

Accordingly, what is needed is a method and system that is capable of reading these bits at a higher data rate with a similar or improved SNR. The method and system should be simple and capable of being easily adapted to existing technology. The present invention addresses these needs.

SUMMARY OF THE INVENTION

The present invention includes a data storage device and a method of reading data in a data storage device. Accordingly, a first aspect of the present invention is a data storage device. The data storage device includes a probe tip mounted on a suspension mechanism, a data storage layer, at least one conducting layer wherein a capacitance is formed between the at least one conducting layer and the suspension mechanism and a sensor for sensing a change in the capacitance based on a displacement of the probe tip due to the presence of a bit.

A second aspect of the present invention is a method of reading data in a data storage device. The method includes suspending a probe tip over at least one layer of material via a suspension mechanism, providing at least one conducting layer wherein a capacitance is formed between the at least one conducting layer and the suspension mechanism and sensing a change in capacitance based on a displacement of the probe tip due to the presence of a bit.

Other aspects and advantages of the present invention will become apparent from the following detailed description, taken in conjunction with the accompanying drawings, illustrating by way of example the principles of the invention.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

The present invention relates to a data storage device and a method of reading data in a data storage device. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiment shown but is to be accorded the widest scope consistent with the principles and features described herein.

Based on varying embodiments of the present invention, a data storage device and a method of reading data in a data storage device are disclosed. The device includes a probe tip suspended over a storage medium via a suspension mechanism. Accordingly, as the probe tip is scanned over the storage medium, a gap between the tip and the underlying storage medium varies as the tip encounters topographic bits in the storage medium. As the gap between the tip and the underlying storage medium changes, the capacitance between the probe tip/suspension and other components of the device varies. Accordingly, a readout scheme can be implemented whereby the capacitance between the probe tip/suspension and other components is monitored.

Figure 1:
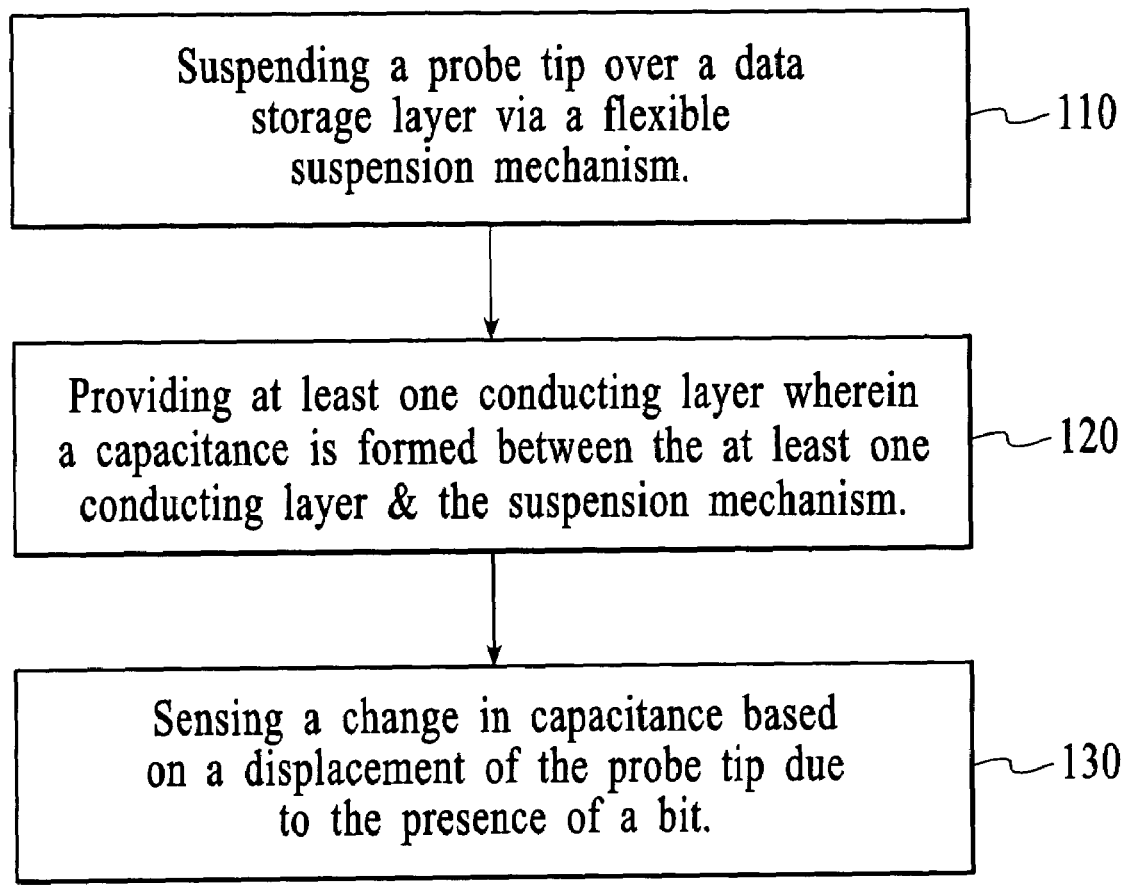
FIG. 1 is a flowchart of a method in accordance with an embodiment of the present invention.

FIG. 1 shows a high-level flowchart of a method in accordance with an embodiment of the present invention. A first step 110 involves suspending a probe tip over a data storage layer via a suspension mechanism. In an embodiment, the suspension mechanism is a flexible suspension mechanism. A second step 120 involves providing at least one conducting layer wherein a capacitance is formed between the at least one conducting layer and the suspension mechanism. A final step 130 includes sensing a change in the capacitance based on a displacement of the probe tip. In an embodiment, the displacement is caused by the presence of a topographic bit in the data storage layer.

Figure 2:
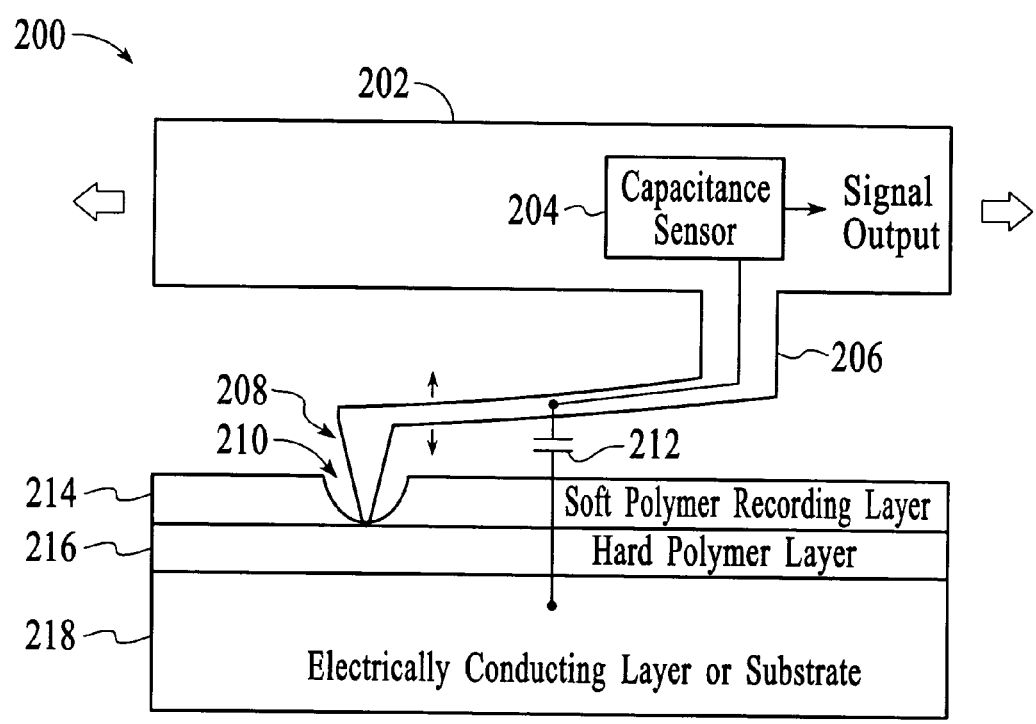
FIG. 2 is an illustration of a data storage system in accordance with an embodiment of the present invention.

FIG. 2 is an illustration of a system 200 for storing data in accordance with an embodiment of the present invention. The system 200 includes a suspension mechanism 202 that includes a capacitance sensor 204 and a cantilever 206. In an embodiment, a flexible cantilever 206 is employed thus creating a flexible suspension mechanism 202. Although the embodiment of FIG. 2 shows the capacitance sensor 204 coupled within the suspension mechanism 202, it is possible that part of the capacitance sensor 204 (e.g. some of the electronics) could be more remote and not on the actual suspension mechanism 204. A probe tip 208 is coupled to the cantilever 206.

The system 200 also includes at least one layer of material. In an embodiment, the layers include two polymer layers 214, 216. The first polymer layer 216 serves as a data storage medium whereby data is stored on the first polymer layer 216 in the form of a bit 210. The second polymer layer 216 acts to limit the depth of the bit(s) 210 in the first polymer layer 214. In an embodiment, the first polymer layer 214 is a soft polymer layer (e.g. polymethylmethacrylate) whereas the second polymer layer 216 is harder (e.g. SU8). Although the second polymer layer 216 is somewhat harder than the first polymer layer 214, the second polymer layer 216 should still be soft enough to help protect the probe tip 208 from wear and shock.

Finally, the system 200 includes a conducting layer 218 wherein a capacitance 212 is formed between the cantilever 206 and the conducting layer 218. In alternate embodiments, the conducting layer 218 can be a conducting thin film such as a deposited metal film of Mo, Cu, TA or an alloy of several elements. It could also be multiple metal layers with different compositions. The conducting layer 218 could also be a conducting substrate such as highly doped silicon.

Accordingly, data is read from the first polymer layer (data storage medium) 214 by scanning the probe tip 208 over the first polymer layer 216. As the probe tip 208 is scanned over the first polymer layer 214, the probe tip 208 encounters a bit 210 and the gap between the tip 208 and the conducting layer 218 changes. A bit 210 can be a pit, a hill or any other change in the topography of the storage medium 214. Accordingly, when the gap between the probe tip 208 and the conducting layer 218 changes, the capacitance sensor 204 senses a change in the capacitance 212 due to a change in the position of the capacitive elements on cantilever 206 relative to the non-moving capacitive elements on the storage medium 214. An important feature of this invention is that a change in topography recorded in a small area can be sensed by a sharp probe and translated into a change in a capacitive gap over a large area, which provides a large signal.

The capacitance 212 between the cantilever 206 and the conducting layer 218 can be between 1 to 2 femto-Farads (10 E-15 F) for a typical cantilever design, however modifications to the cantilever design to optimize for a capacitive read could potentially increase this by a factor of 2 (2-4 femto-Farads) or more. In addition, the distance between the cantilever 206 and the data storage medium 214 can be adjusted (e.g. from 200 mn to at least 100 nm) thereby resulting in approximately another factor of 2 (4-8 femto-Farads) increase. The reduction in the distance would also increase the signal (Delta Capacitance) relative to the total capacitance. Signal improvements can also be achieved by increasing the voltage applied to the capacitance 212. This increases the signal available for detecting changes in capacitance 212. For example, with an applied voltage of 10 volts and an assumed total capacitance of 2 fF, a delta capacitance of 5% (100 aF) provides a signal of 50 mV at the output of a charge pre-amp with a 20 fF feedback capacitor.

It should be noted the above-described scheme can be employed with any storage medium in which bits are stored topographically. Accordingly, the data storage medium can be any material or set of materials in which bits can be stored topographically. The bits can be either pits or protrusions, or combinations of both and written by means other than thermal writing. Additionally, multiple probe tips and conducting materials (regions) can be used in parallel to achieve higher data read and write rates. Also, a flexible suspension other than a cantilever can be used.

Figure 3:
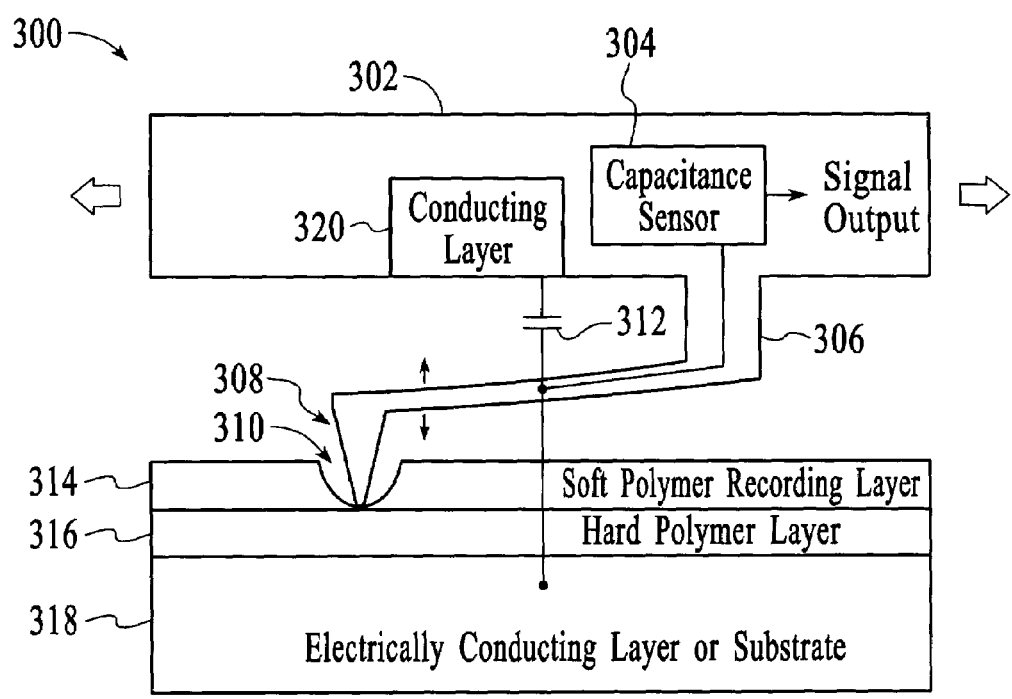
FIG. 3 is an illustration of a data storage system in accordance with an alternate embodiment of the present invention.

In an alternate embodiment, the capacitance can be measured between different portions of the suspension mechanism. FIG. 3 is an illustration of a data storage system 300 in accordance with an alternate embodiment of the present invention. Similar to system 200 (see FIG. 2), data storage system 300 includes a suspension mechanism 302 that includes a capacitance sensor 304 and a cantilever 306. In this embodiment, the suspension mechanism 302 includes a conducting layer 320 wherein a capacitance 312 is formed between the cantilever 306 and the conducting layer 320. Again, the probe tip 308 is coupled to the cantilever 306. The soft polymer layer 314 serves as a data storage medium whereas a harder polymer layer 316 limits the depth of the bit(s) 310 in the soft polymer layer 314. The harder polymer layer 316 is deposited upon a layer 318. In this embodiment, the capacitance sensor 304 senses a change in the capacitance 312 based on the displacement of the probe tip 308.

Figure 4:
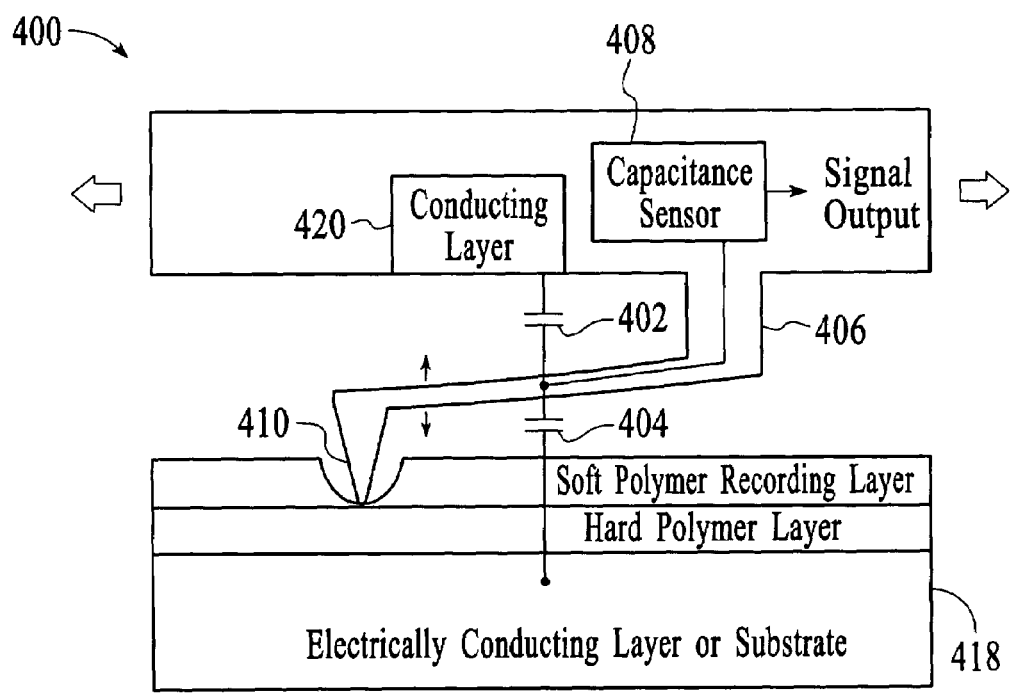
FIG. 4 shows a data storage system in accordance with another embodiment of the present invention.

In yet another alternate embodiment of the present invention, data is read by monitoring a difference in capacitance between a first capacitance and a second capacitance. FIG. 4 shows a data storage system 400 in accordance with an alternate embodiment of the present invention. The system 400 includes a first capacitance 402 formed on a first side of cantilever 406 between the cantilever 406 and a first conducting layer 420. The system 400 also includes a second capacitance 404 formed on a second side of the cantilever 406 between the cantilever 406 and a second conducting layer 418. Accordingly, the capacitance sensor 408 senses a difference in capacitance between the first capacitance 402 and the second capacitance 404 based on the displacement of the probe tip 410. By implementing a first and second capacitance 402, 404 as shown, some common-mode noise sources can be ameliorated.

It should be noted that the capacitances 402, 404 can be made larger by using a larger area. For example, the probe tip 410 can be positioned at the end of a relatively large area cantilever 406 that has a conducting film deposited on it. Consequently, the conducting film acts effectively as one plate of capacitance 402 or 404. The size, shape and material properties of the plate and suspension must be consistent with the desired mechanical properties of the suspension which in many cases are dictated by requirements on bandwidth, tip/media loading force, dynamic range, etc. Accordingly, the sharp probe tip provides high spatial resolution but the relatively large area of the capacitive portions of the suspension provides a large signal. This results in a large change in the capacitance based on a small displacement of the probe tip.

Note also that the conducting plates that form the capacitances should be kept as close together as possible while at the same time minimizing the amount of material between the plates as well as the dielectric constant of the materials between the plates. This helps maximize the fractional variation of the capacitances for a given depth or height of the written bits. For example, based on the embodiment of FIG. 2, when capacitances 212 is monitored, it may be desirable to use a metal coating on the bottom of the cantilever 206 (nearest the storage layer 214) so that the material of the cantilever does not contribute to the capacitance 212. In this case, it could also be beneficial to make the storage layer 214 above the conducting layer 218 as thin as possible while minimizing the dielectric constant. Again, this would aid in maximizing the fractional change in the capacitance 212 as the tip 208 is scanned over the storage layer 214.

Figure 5:
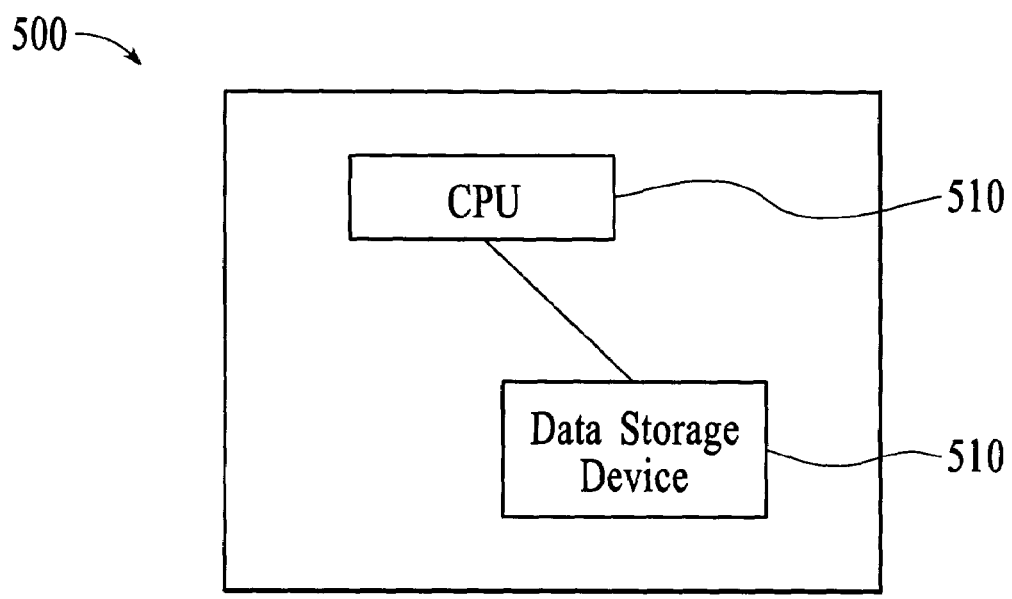
FIG. 5 shows a data storage system in accordance with another embodiment of the present invention.

Another embodiment of the present invention includes a computer system that implements a data storage device in accordance with the present invention. FIG. 5 shows a computer system 500 in accordance with an alternate embodiment of the present invention. The computer system 500 includes a central processing unit (CPU) 510 coupled to a data storage device 520. It should be understood that the data storage device 520 could be one of the above-described embodiments of data storage devices.

A data storage device and a method of reading data in a data storage device has been disclosed. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

We claim:

1. A data storage device comprising:
a probe tip mounted on a suspension mechanism;
a data storage layer;
a first conducting layer arranged opposite to the suspension mechanism and separate from the data storage layer wherein a first capacitance is formed between the suspension mechanism and the first conducting layer on a first side of the suspension mechanism and a second capacitance is formed on a second conducting layer on a second side of the suspension mechanism arranged opposite to the data storage layer and separate from the first conducting layer; and
a sensor for sensing a change in the capacitance based on a displacement of the probe tip due to the presence of a bit.

2. The data storage device of claim 1 wherein the data storage layer is in contact with the probe tip.

3. The data storage device of claim 2 wherein the data storage layer includes the bit and the bit comprises at least one of a pit or a protrusion.

4. The data storage device of claim 1 wherein the data storage layer comprises a polymer material.

5. The data storage device of claim 1 wherein the at least one conducting layer comprises a conducting thin film.

6. The data storage device of claim 5 wherein the conducting thin film comprises at least one of a deposited metal film of Mo, Cu, TA.

7. The data storage device of claim 1 wherein the conducting layer comprises a conducting substrate.

8. The data storage device of claim 7 wherein the conducting substrate comprises a doped silicon material.

9. The data storage device of claim 1 wherein the suspension mechanism includes a flexible cantilever.

10. The data storage device of claim 9 wherein the capacitance is formed on at least one side of the flexible cantilever.

11. The data storage device of claim 10 wherein the change in capacitance comprises a difference in capacitance between the first capacitance and the second capacitance.

12. A method of reading data from a data storage device comprising:
suspending a probe tip over a data storage layer via a suspension mechanism;

providing a first conducting layer arranged opposite to the suspension mechanism and separate from the data storage layer wherein a first capacitance is formed between the suspension mechanism and the first conducting layer on a first side of the suspension mechanism and a second capacitance is formed on a second conducting layer on a second side of the suspension mechanism arranged opposite to the data storage layer and separate from the first conducting layer; and reading data from the storage device by sensing a change in the capacitance based on a displacement of the probe tip due to the presence of a bit.

13. The method of claim 12 wherein the data storage layer comprises a polymer material.

14. The method of claim 12 wherein the at least one conducting layer comprises a conducting thin film.

15. The method of claim 14 wherein the conducting thin film comprises at least one of a deposited metal film of Mo, Cu, TA, and an alloy.

16. The method of claim 12 wherein the at least one conducting layer comprises a conducting substrate.

17. The method of claim 16 wherein the conducting substrate comprises a doped silicon material.

18. The method of claim 12 wherein the suspension mechanism further includes a flexible cantilever and the act of providing at least one conducting layer further comprises providing a conducting layer within the suspension mechanism whereby a capacitance is formed between the conducting layer and the flexible cantilever.

19. The method of claim 18 wherein the act of sensing a change in capacitance comprises sensing a difference in capacitance between the first and second capacitance.

20. The method of claim 12 wherein the data storage layer includes the bit and the bit comprises at least one of a pit or protrusion.

* * * * *

UNITED STATES PATENT AND TRADEMARK OFFICE
CERTIFICATE OF CORRECTION

PATENT NO. : 7,373,265 B2 Page 1 of 1
APPLICATION NO. : 10/660297
DATED : May 13, 2008
INVENTOR(S) : Gary A. Gibson et al.

It is certified that error appears in the above-identified patent and that said Letters Patent is hereby corrected as shown below:

In column 4, line 22, after "Cu," delete "TA" and insert -- Ta --, therefor.

In column 4, line 50, delete "200 mn" and insert -- 200 nm --, therefor.

In column 6, line 50, in Claim 6, after "Mo, Cu," delete "TA" and insert -- Ta, and an alloy --, therefor.

In column 6, line 51, in Claim 7, after "wherein the" insert -- at least one --.

Signed and Sealed this

Seventh Day of October, 2008

JON W. DUDAS
*Director of the United States Patent and Trademark Office*